(12) United States Patent
Gandhi

(10) Patent No.: US 8,454,177 B2
(45) Date of Patent: Jun. 4, 2013

(54) LOW COST PARABOLIC SOLAR CONCENTRATOR AND METHOD TO DEVELOP THE SAME

(75) Inventor: Umesh N. Gandhi, Farmington Hills, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 233 days.

(21) Appl. No.: 13/028,941

(22) Filed: Feb. 16, 2011

(65) Prior Publication Data

US 2012/0204862 A1 Aug. 16, 2012

(51) Int. Cl.
*G02B 5/10* (2006.01)
*F24J 2/10* (2006.01)

(52) U.S. Cl.
USPC .......................... 359/864; 126/684; 126/696

(58) Field of Classification Search
USPC .................................. 359/864; 126/684, 696
See application file for complete search history.

(56) References Cited

U.S. PATENT DOCUMENTS

| | | | |
|---|---|---|---|
| 4,056,309 A | 11/1977 | Harbison et al. | |
| 4,115,177 A | 9/1978 | Nelson | |
| 4,124,277 A | 11/1978 | Stang | |
| 4,162,825 A | 7/1979 | Dowty | |
| 4,243,301 A | 1/1981 | Powell | |
| 4,318,394 A | 3/1982 | Alexander | |
| 4,337,997 A | 7/1982 | Sadoune et al. | |
| 4,340,031 A | 7/1982 | Niedermeyer | |
| 4,343,533 A | 8/1982 | Currin et al. | |
| 4,432,345 A | 2/1984 | McIntire | |
| 4,469,089 A | 9/1984 | Sorko-Ram | |
| 4,487,196 A | 12/1984 | Murphy | |
| 4,493,313 A | 1/1985 | Eaton | |
| 4,515,148 A | 5/1985 | Boy-Marcotte et al. | |
| 4,571,812 A | 2/1986 | Gee | |
| 4,597,377 A | 7/1986 | Melamed | |
| 4,731,617 A | 3/1988 | Gray et al. | |
| 5,104,211 A * | 4/1992 | Schumacher et al. | 359/853 |
| 6,363,928 B1 | 4/2002 | Anderson, Jr. | |
| 7,156,531 B2 | 1/2007 | Rudi | |
| 7,309,398 B2 | 12/2007 | Blackmon et al. | |
| 2003/0183221 A1 | 10/2003 | Karnaukhov et al. | |
| 2007/0221313 A1 | 9/2007 | Franck et al. | |
| 2007/0223096 A1 | 9/2007 | O'Connor et al. | |
| 2009/0107484 A1* | 4/2009 | Bender | 126/569 |
| 2009/0211569 A1 | 8/2009 | Garcia-Conde Noriega et al. | |

(Continued)

FOREIGN PATENT DOCUMENTS

| | | |
|---|---|---|
| CH | 571199 | 11/1975 |
| CN | 101697030 | 4/2010 |
| GB | 2042761 | 9/1980 |
| WO | WO 03/022578 | 3/2003 |

*Primary Examiner* — Jade R Chwasz
(74) *Attorney, Agent, or Firm* — Snell & Wilmer LLP

(57) ABSTRACT

A low cost parabolic solar concentrator can be formed by deforming a hybrid plate. Force can be placed on an edge portion of the hybrid plate and/or a middle portion of the hybrid plate. The selective application of the force deforms the hybrid plate into a parabolic solar concentrator, instead of a sinusoidal shape. The hybrid plate can be formed from a first plate, a second plate, and a third plate attached to each other. The characteristics of the first plate, the second plate, and the third plate, can be chosen to allow the hybrid plate to be deformed into the parabolic shape with the selective application of forces.

20 Claims, 5 Drawing Sheets

U.S. PATENT DOCUMENTS

| | | |
|---|---|---|
| 2009/0260620 A1 | 10/2009 | Winger et al. |
| 2009/0314280 A1 | 12/2009 | Banerjee |
| 2010/0170560 A1 | 7/2010 | Sapienza et al. |
| 2010/0199972 A1 | 8/2010 | Brost |
| 2010/0263709 A1 | 10/2010 | Norman et al. |
| 2010/0282295 A1 | 11/2010 | Gomery |
| 2011/0000522 A1 | 1/2011 | Bender |

* cited by examiner

LOW COST PARABOLIC SOLAR CONCENTRATOR AND METHOD TO DEVELOP THE SAME

BACKGROUND

1. Field

The present invention relates to a low cost parabolic solar concentrator and method to develop the same.

2. Description of the Related Art

To produce a conventional parabolic solar concentrator, a single plate is normally used. However, producing the conventional parabolic solar concentrator from the single plate is difficult and expensive. When force is applied to an edge portion of the single plate and/or a middle portion of the single plate, the single plate would be in a sinusoidal shape, and prone to being over bent or under bent. The single plate would not be in a parabolic shape. Thus, incremental force has to be applied to the single plate to ensure that the single plate is in the parabolic shape. In addition, the single plate has to be smoothed out to ensure that there are no lumps from the incremental force so that the single plate can be used to concentrate light. However, this method is generally expensive and inaccurate since it is difficult to repetitively apply the incremental force and repetitively smooth out the single plate in order to form the conventional parabolic solar concentrator.

Alternatively, parabolic molds can be used. However, each parabolic mold is generally expensive to produce. While this may be acceptable for a conventional parabolic solar concentrator with only a single size and shape, it is unacceptable if the conventional parabolic solar concentrators are in multiple sizes and shapes. This is because each size or shape of the conventional parabolic solar concentrators would require a different mold, which can rapidly increase expenses. Therefore, this approach is also undesirable.

Thus, there is a need for a low cost parabolic solar concentrator and method to develop the same.

SUMMARY

The present invention relates to a low cost parabolic solar concentrator and method to develop the same. The parabolic solar concentrator can be formed by deforming a hybrid plate. Force can be applied to an edge portion of the hybrid plate and/or a middle portion of the hybrid plate. Alternatively, the edge portion and/or the middle portion can be held in place while force is applied to the portion that is not held in place. When force is applied in such a manner to the hybrid plate, the hybrid plate is deformed into a parabolic solar concentrator, instead of a sinusoidal shape. Thus, the use of the hybrid plate allows for an easy and low cost formation of the parabolic solar concentrator.

The hybrid plate can be formed, for example, from a first plate, a second plate, and/or a third plate attached to each other. The first plate can have a first thickness and/or a first length. The second plate can have a second thickness and/or a second length. The third plate can have a third thickness and/or a third length.

The first length, the second length, and/or the third length can be selected to allow the hybrid plate to be deformed into the parabolic shape with the application of forces on the edge portion of the hybrid plate and/or the middle portion of the hybrid plate. The first thickness, the second thickness, and the third thickness can be selected to allow the hybrid plate to be deformed into the parabolic shape with the application of forces on the edge portion of the hybrid plate and/or the middle portion of the hybrid plate.

Likewise, the first plate, the second plate, and/or the third plate can be formed from a first material, a second material, and/or a third material. The first material, the second material, and/or the third material can be selected to allow the hybrid plate to be deformed into the parabolic shape with the application of forces on the edge portion of the hybrid plate and/or the middle portion of the hybrid plate.

Thus, the characteristics of the first plate, the second plate, and the third plate, can be chosen to allow the hybrid plate to be deformed into the parabolic shape with the application of forces on the edge portion of the hybrid plate and/or the middle portion of the hybrid plate. This can reduce a cost of producing a parabolic solar concentrator.

The present invention can also include a parabolic solar concentrator production unit including a plate selection unit, an attachment unit, a hybrid plate deformation unit, and/or a control unit. The plate selection unit can select the first plate, the second plate, and the third plate with the desired characteristics. The attachment unit can attach the first plate, the second plate, and/or the third plate to each other to form the hybrid plate. The hybrid plate deformation unit can deform the hybrid plate into a parabolic solar concentrator. The control unit can control the operations of the plate selection unit, the attachment unit, and/or the hybrid plate deformation unit.

In one embodiment, the present invention is a method for forming a parabolic solar concentrator including attaching a first plate having a first length with a second plate having a second length less than the first length to form a hybrid plate, and deforming the hybrid plate to thereby form a parabolic solar concentrator from the hybrid plate.

In another embodiment, the present invention is a method for forming a parabolic solar concentrator including attaching a first plate having a first length with a second plate having a second length less than the first length, attaching a third plate having a third length less than the second length to the second plate to form a hybrid plate, and applying force to a circular edge of the hybrid plate, or a middle portion of the hybrid plate.

In yet another embodiment, the present invention is a parabolic solar concentrator including a hybrid plate deformed into a parabolic shape including a first plate having a first length equal to a length of the hybrid plate prior to deformation of the hybrid plate, and a second plate having a second length less than the first length prior to deformation of the hybrid plate, and attached to the first plate.

BRIEF DESCRIPTION OF THE DRAWINGS

The features, obstacles, and advantages of the present invention will become more apparent from the detailed description set forth below when taken in conjunction with the drawings, wherein.

DETAILED DESCRIPTION

Apparatus, systems and methods that implement the embodiments of the various features of the present invention will now be described with reference to the drawings. The drawings and the associated descriptions are provided to illustrate some embodiments of the present invention and not to limit the scope of the present invention. Throughout the drawings, reference numbers are re-used to indicate correspondence between referenced elements.

Figure 1:
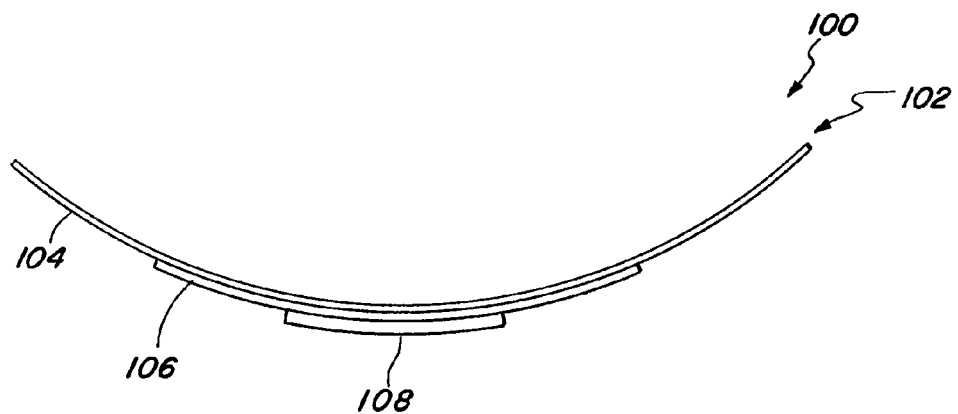
FIG. 1 depicts a parabolic solar concentrator formed from a hybrid plate according to an embodiment of the present invention.

In one embodiment, the present invention includes, for example, a parabolic solar concentrator 100 as shown in FIG. 1. The parabolic solar concentrator 100 can be formed, for example, from a hybrid plate 102 that is deformed into a parabolic shape. The hybrid plate 102 can include, for example, a first plate 104, a second plate 106, and/or a third plate 108. The parabolic solar concentrator 100 can be formed from the hybrid plate 102 by deforming the hybrid plate 102 into a parabolic shape through the application of forces on an edge portion of the hybrid plate 102 and/or a middle portion of the hybrid plate 102, which will be described in more detail later.

Figure 2:
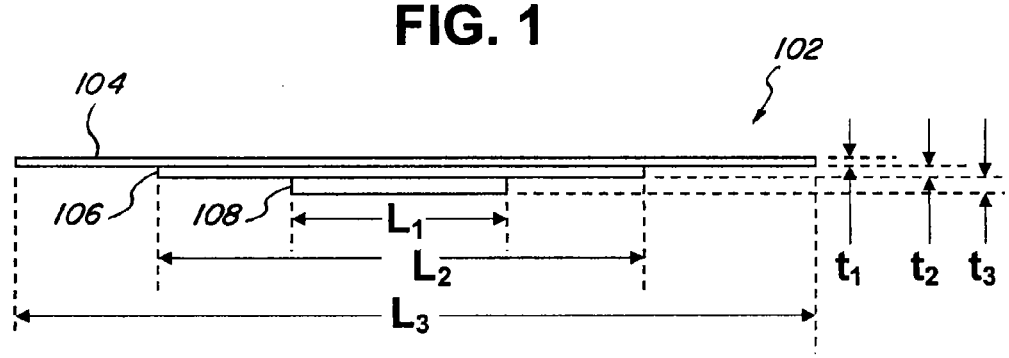
FIG. 2 depicts a hybrid plate according to an embodiment of the present invention.

FIG. 2 depicts the hybrid plate 102 prior to deformation. As seen in FIG. 2, the first plate 104 is attached to the second plate 106. The third plate 108 is attached to the second plate 106. The first plate 104, the second plate 106, and the third plate 108 can be attached to each other, for example, by welding, gluing, using rivets, fastening, or other appropriate methods and means.

The first plate 104 can be formed, for example, from a first material, while the second plate 106 can be formed, for example, from a second material, and the third plate 108 can be formed, for example, from a third material. In one embodiment, the first plate 104 can be formed, for example, from a material which can include at least a single reflective side. In another embodiment, the first plate 104 can be formed, for example, from a material which is conducive to be coated with a reflective material. In yet another embodiment, the first plate 104 can be formed, for example, from a material which is conducive to having a reflective material attached to a side of the first plate 104. The second material and the third material can be formed, for example, from a material which does not need to be reflective.

In addition, the first material, the second material, and the third material can be selected based on their malleability and/or stiffness. This can aid, for example, when deforming the hybrid plate 102 into a parabolic shape to form the parabolic concentrator 100. In one embodiment, the first material, the second material, and/or the third material can be selected to allow the hybrid plate 102 to be deformed into the parabolic shape with the application of forces on the edge portion of the hybrid plate 102 and/or the middle portion of the hybrid plate 102. The first material, the second material, and the third material can be formed from the same material. However, it is understood that the first material, the second material, and/or the third material need not be the same material, but instead can be selected to optimize the ease of deformation of the hybrid plate 102 into the parabolic shape.

The first plate 104 has a length L1, the second plate 106 has a length L2, and the third plate 108 has a length L3. In FIG. 2, the length L1 is greater than the length L2, and the length L2 is greater than the length L3. The difference in length allows for an easier deformation of the hybrid plate 102 into a parabolic shape. In one embodiment, the length L1, the length L2, and/or the length L3 can be selected to allow the hybrid plate 102 to be deformed into the parabolic shape with the application of forces on the edge portion of the hybrid plate 102 and/or the middle portion of the hybrid plate 102.

Furthermore, the first plate 104 can have a thickness t1, the second plate 106 can have a thickness t2, and the third plate 108 can have a thickness t3. In one embodiment, the first plate 104, the second plate 106, and/or the third plate 108 can have a constant thickness. The thickness t1, the thickness t2, and the thickness t3 can be selected to allow the hybrid plate 102 to be deformed into the parabolic shape with the application of forces on the edge portion of the hybrid plate 102 and/or the middle portion of the hybrid plate 102.

In FIG. 2, the thickness t1 is different than the thickness t2 and the thickness t3. Likewise, the thickness t2 is different than the thickness t1 and the thickness t3, and the thickness t3 is different than the thickness t1 and the thickness t2. However, in some embodiments, one or more of the thicknesses t1, t2, and t3 may be identical to or substantially the same as another thickness. The thicknesses t1, t2, and t3 can be adjusted so that deformation of the hybrid plate 102 into a parabolic shape can be completed in an easier, quicker and more cost-efficient manner.

Figure 3:
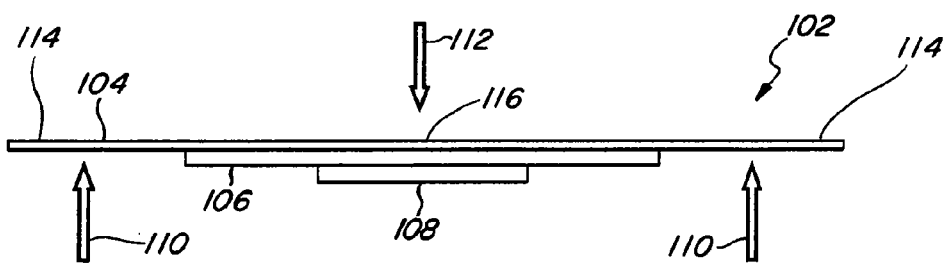
FIG. 3 depicts a hybrid plate with application of forces according to an embodiment of the present invention.

To form the parabolic solar concentrator 100, force 110 can be applied to an edge portion 114 of the hybrid plate 102 and/or a force 112 can be applied to a middle portion 116 of the hybrid plate 102 as seen in FIG. 3. In one embodiment, only the force 110 is applied to the edge portion 114 of the hybrid plate 102, while the middle portion 116 of the hybrid plate 102 is held. In another embodiment, only the force 112 is applied to the middle portion 116 of the hybrid plate 102, while the edge portion 114 of the hybrid plate 102 is held in place.

Figure 4:
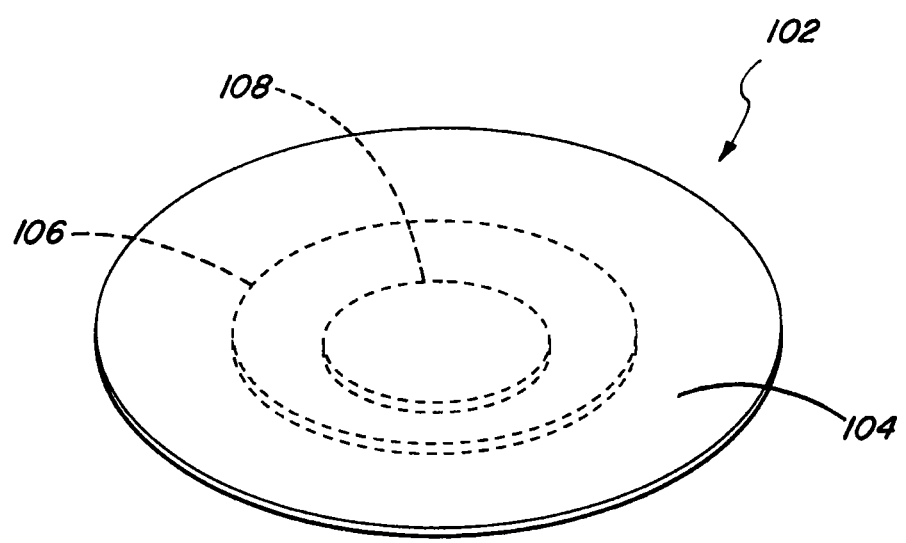
FIG. 4 is a perspective view of a hybrid plate according to an embodiment of the present invention.

The hybrid plate 102 can be formed, for example, in a circular shape as shown in FIG. 4. In such a case, the edge portion 114 of the hybrid plate 102 can be, for example, a circular edge portion of the hybrid plate 102 when the hybrid plate 102 is circular. However, the hybrid plate 102 can be formed, for example, from other types of shapes, such as rectangular, or any other shape which can form the parabolic solar concentrator 100.

Figure 5:
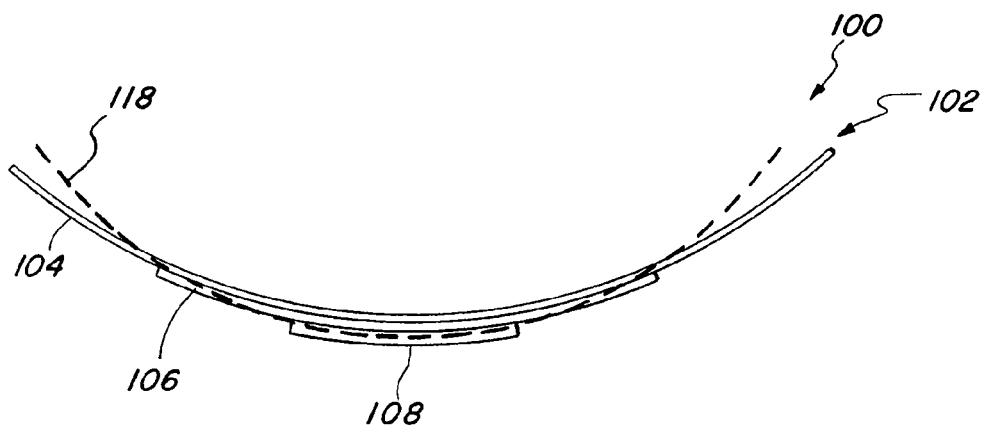
FIG. 5 depicts a hybrid plate deformed into a parabolic solar concentrator according to an embodiment of the present invention.

As seen in FIG. 5, the selective application of force to the hybrid plate 102 produces the parabolic solar concentrator 100. However, the same selective application of force to a conventional plate will produce a conventional curved concentrator 118 with a sinusoidal shape. As can be seen in FIG. 5, the conventional curved concentrator 118 will be over bent or under bent and is not in the parabolic shape when force is applied to its edge portion and/or middle portion. Instead incremental amounts of force will have to be applied over the conventional plate to form the conventional curved concentrator 118.

However, in the present invention, when force is applied to an edge portion of the hybrid plate 102 and/or a middle portion of the hybrid plate 102, the parabolic solar concentrator 100 is formed. The characteristics of the first plate 104, the second plate 106, and/or the third plate 108 can be controlled to ensure that easy application of force at the edge portion of the hybrid plate 102 and/or the middle portion of the hybrid plate 102 produces the parabolic solar concentrator 100. This can reduce or eliminate a requirement of complex application of force to produce the parabolic solar concentrator 100. Since the complex application of force is expensive and time consuming, this can reduce a cost of producing the parabolic solar concentrator 100.

Figure 6:
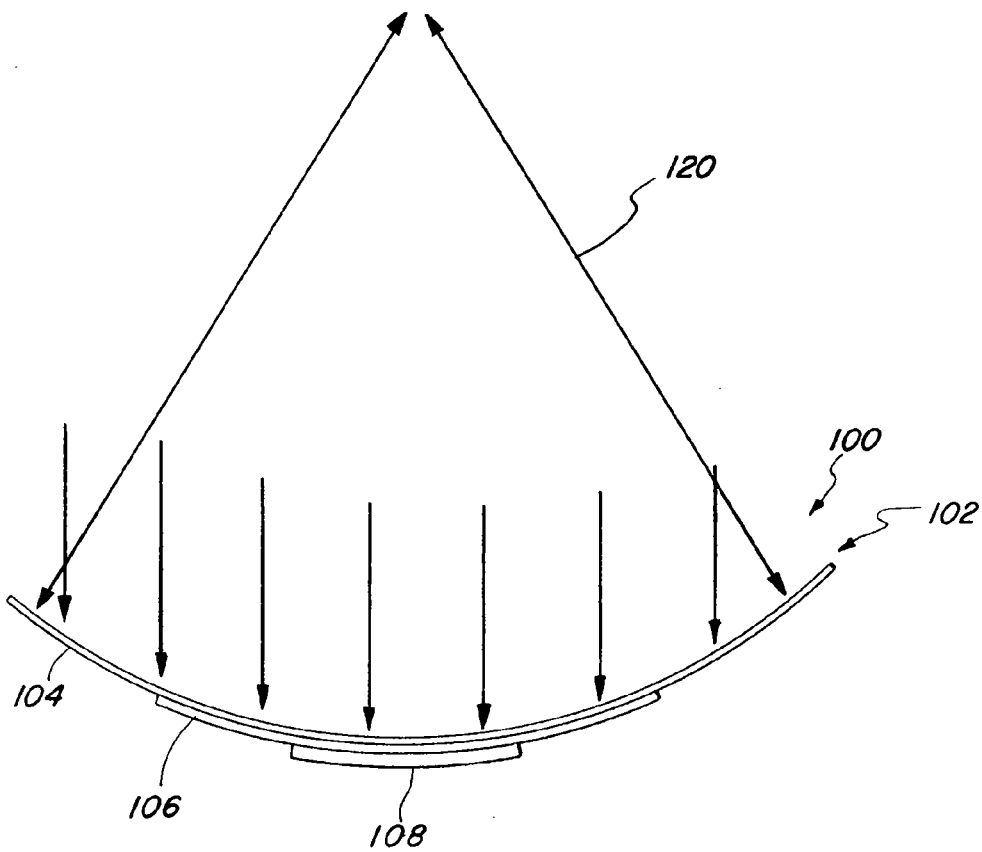
FIG. 6 depicts a parabolic solar concentrator according to an embodiment of the present invention.

As seen in FIG. 6, the parabolic solar concentrator 100 can reflect and concentrate the light 120. The parabolic solar concentrator 100 is more efficient at concentrating the light 120 than the conventional curved concentrator 118.

Figure 7:
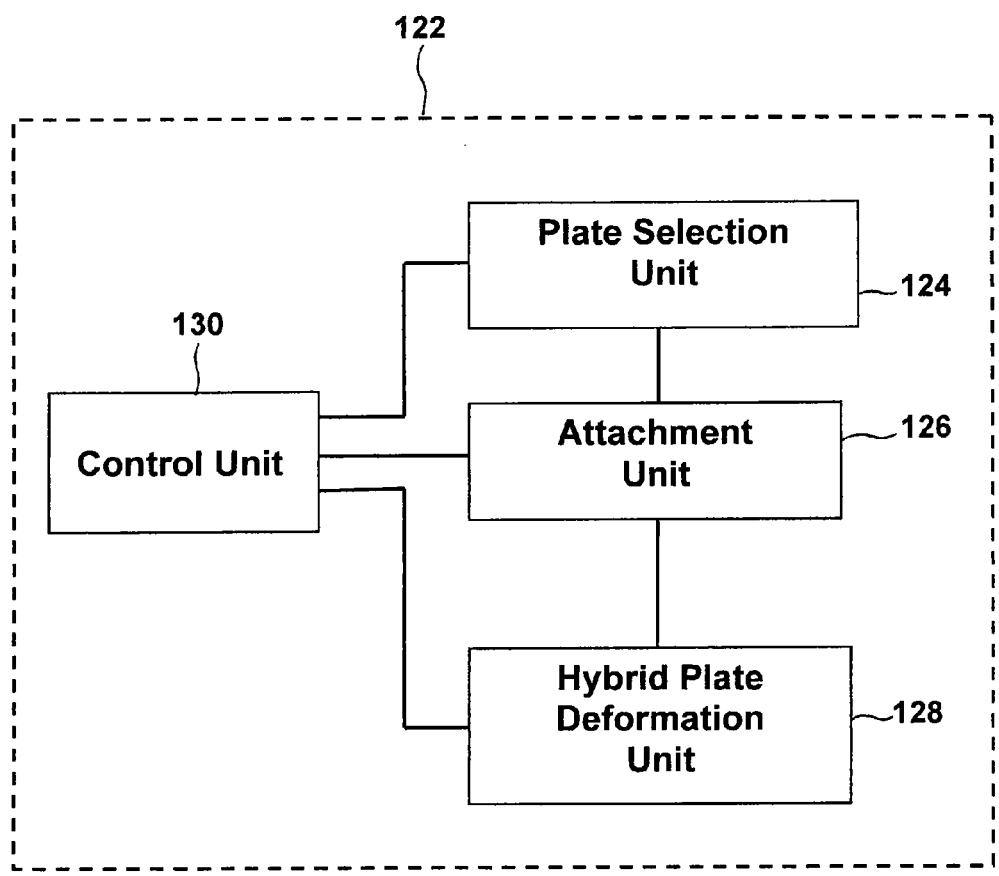
FIG. 7 depicts a parabolic solar concentrator production unit according to an embodiment of the present invention.

In one embodiment, the present invention can include, for example, a parabolic solar concentrator production unit 122 as shown in FIG. 7. The parabolic solar concentrator production unit 122 can be used to produce the hybrid plate 102 and/or deform the hybrid plate 102 to form the parabolic solar concentrator 100. As seen in FIG. 7, the parabolic solar concentrator production unit 122 can include, for example, a plate selection unit 124, an attachment unit 126, a hybrid plate deformation unit 128, and/or a control unit 130.

The plate selection unit 124 can, for example, select the first plate 104, the second plate 106, and/or the third plate 108 to form the hybrid plate 102. The plate selection unit 124 can select the first plate 104, the second plate 106, and/or the third plate 108 to have characteristics which allow the hybrid plate 102 to be deformed into the parabolic shape with the application of the forces 110 and/or 112.

The attachment unit 126 can, for example, attach the first plate 104, the second plate 106, and/or the third plate 108 together. The hybrid plate deformation unit 128 can, for example, deform the hybrid plate 102 through the application of the forces 110 and/or 112. In one embodiment, the hybrid plate deformation unit 128 can also, for example, hold the edge portion 114 and/or the middle portion 116. The control unit 130 can, for example, control the operations of the plate selection unit 124, the attachment unit 126, and/or the hybrid plate deformation unit 128.

Figure 8:
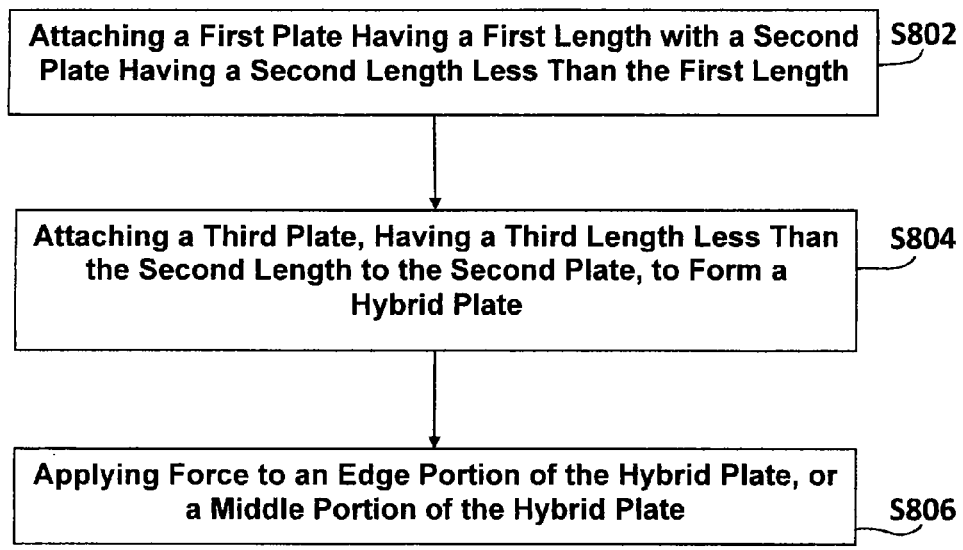
FIG. 8 depicts a flowchart of a method or process of forming a parabolic solar concentrator according to an embodiment of the present invention.

In one embodiment, the present invention is a method or process of forming a parabolic solar concentrator as shown in the flowchart of FIG. 8. In Step S802, a first plate having a first length is attached with a second plate having a second length less than the first length. For example, the first plate 104 having a first length L1, can be attached to the second plate 106 having a second length L2 using the attachment unit 126 of the parabolic solar concentrator production unit 122. The second length L2 can be less than the first length L1.

In step S804, a third plate having a third length less than the second length can be attached to the second plate to form a hybrid plate. For example, the third plate 108 having a third length L3 less than the second length L2 can be attached to the second plate 106 using the attachment unit 126. In Step S806, force is applied to an edge portion of the hybrid plate, or a middle portion of the hybrid plate. For example, force can be applied only to an edge portion of the hybrid plate 102, or a middle portion of the hybrid plate 102 using the hybrid plate deformation unit 128.

Those of ordinary skill would appreciate that the various illustrative logical blocks, modules, and algorithm steps described in connection with the examples disclosed herein may be implemented as electronic hardware, computer software, or combinations of both. Furthermore, the present invention can also be embodied on a machine readable medium causing a processor or computer to perform or execute certain functions.

To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The various illustrative logical blocks, units, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the examples disclosed herein may be embodied directly in hardware, in a software module executed by a processor, or in a combination of the two. The steps of the method or algorithm may also be performed in an alternate order from those provided in the examples. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC). The ASIC may reside in a wireless modem. In the alternative, the processor and the storage medium may reside as discrete components in the wireless modem.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A method for forming a parabolic solar concentrator comprising:
providing a first plate having a first top surface, a first bottom surface and a first length;
providing a second plate having a second top surface, a second bottom surface and a second length, the second length being greater than the first length;
attaching the second bottom surface to the first top surface to form a hybrid plate; and
deforming the hybrid plate to thereby form a parabolic solar concentrator from the hybrid plate.

2. The method of claim 1 wherein the step of deforming the hybrid plate to thereby form the parabolic solar concentrator from the hybrid plate includes applying force to an edge portion of the hybrid plate or a middle portion of the hybrid plate.

3. The method of claim 2 wherein step of deforming the hybrid plate to thereby form the parabolic solar concentrator from the hybrid plate includes holding the edge portion and preventing the edge portion from moving, or holding the middle portion and preventing the middle portion from moving.

4. The method of claim 3 wherein the first length and the second length are selected to allow the hybrid plate to be deformed into a parabolic shape from the application of force to only an edge portion of the hybrid plate or a middle portion of the hybrid plate.

5. The method of claim 1 further comprising:
providing a third plate having a third top surface, a third bottom surface and a third length, the third length being greater than the second length; and
attaching the third bottom surface to the second top surface, wherein the first plate, the second plate and the third plate form layers of the hybrid plate.

6. The method of claim 1 wherein:
the first plate has a first thickness defined between the first top surface and the first bottom surface, and the second plate has a second thickness defined between the second top surface and the second bottom surface,
the hybrid plate has a thickness, the thickness of the hybrid plate including at least the first thickness and the second thickness, and
the first thickness and the second thickness are selected to allow the hybrid plate to be deformed into a parabolic shape from the application of force to only an edge portion of the hybrid plate or a middle portion of the hybrid plate.

7. The method of claim 1 further comprising welding the first top surface with the second bottom surface.

8. The method of claim 1 wherein the first plate and the second plate are formed from an elastic material.

9. The method of claim 1 wherein the first plate and the second plate are formed from metal.

10. A method for forming a parabolic solar concentrator comprising:
providing a first plate having a first top surface, a first bottom surface and a first length;
providing a second plate having a second top surface, a second bottom surface and a second length, the second length being greater than the first length;
attaching the second bottom surface to the first top surface;
providing a third plate having a third top surface, a third bottom surface and a third length, the third length being greater than the second length;
attaching the third bottom surface to the second top surface to form a hybrid plate, the hybrid plate including at least the first plate, the second plate and the third plate; and
applying force to a circular edge portion of the hybrid plate, or a middle portion of the hybrid plate.

11. The method of claim 10 further comprising holding the circular edge portion of the hybrid plate and preventing the circular edge of the hybrid plate from moving or holding the middle portion of the hybrid plate and preventing the middle portion from moving.

12. The method of claim 10 wherein the first length, the second length, and the third length are selected to allow the hybrid plate to be deformed into a parabolic shape from the application of force only to the circular edge portion of the hybrid plate or the middle portion of the hybrid plate.

13. The method of claim 10 wherein:
the first plate, the second plate and the third plate form layers of the hybrid plate, and
the first plate has a first thickness, the second plate has a second thickness, and the third plate has a third thickness, wherein the first thickness, the second thickness and the third thickness are selected to allow the hybrid plate to be deformed into a parabolic shape from the application of force only to the circular edge portion of the hybrid plate or the middle portion of the hybrid plate.

14. The method of claim 10 wherein the first plate, the second plate and the third plate are formed from an elastic metal material.

15. A parabolic solar concentrator comprising:
a hybrid plate deformed into a parabolic shape including:
a first plate having a first top surface, a first bottom surface and a first length, the first length being equal to a length of the hybrid plate prior to deformation of the hybrid plate, and
a second plate having a second top surface, a second bottom surface and a second length, the second length being greater than the first length prior to deformation of the hybrid plate, and the second bottom surface being attached to the first top surface.

16. The parabolic solar concentrator of claim 15 further comprising a third plate having a third top surface, a third bottom surface and a third length, the third length being greater than the second length prior to deformation of the hybrid plate, wherein:
the third bottom surface is attached to the second top surface,
the hybrid plate is formed of the first plate, the second plate and the third plate, and
the first length, the second length and the third length are selected to allow the hybrid plate to be deformed into a parabolic shape from the application of force only to an edge portion of the hybrid plate or a middle portion of the hybrid plate.

17. The parabolic solar concentrator of claim 15 wherein:
the first plate, the second plate and the third plate form layers of the hybrid plate, and
the first plate has a first thickness, and the second plate has a second thickness different than the first thickness, wherein the first thickness and the second thickness are selected to allow the hybrid plate to be deformed into a parabolic shape from the application of force only to the edge portion of the hybrid plate or the middle portion of the hybrid plate.

18. The parabolic solar concentrator of claim 15 wherein the first plate and the second plate are formed from metal.

19. The parabolic solar concentrator of claim 15 wherein the first plate and the second plate are formed from an elastic material.

20. The parabolic solar concentrator of claim 15 wherein the first top surface and the second bottom surface are welded to each other.

* * * * *